US011356112B1

(12) United States Patent
Quintero Alonso et al.

(10) Patent No.: US 11,356,112 B1
(45) Date of Patent: Jun. 7, 2022

(54) COARSE-FINE COUNTING ARCHITECTURE FOR A VCO-ADC BASED ON INTERLOCKED BINARY ASYNCHRONOUS COUNTERS

(71) Applicant: Infineon Technologies AG, Neubiberg (DE)

(72) Inventors: Andres Quintero Alonso, Villach (AT); Luis Hernandez-Corporales, Madrid (ES); Francois Marie Leger, Klagenfurt (AT); Carlos Andres Perez Cruz, Santa Cruz del Retamar (ES)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/159,833

(22) Filed: Jan. 27, 2021

(51) Int. Cl.
  *H03M 1/12* (2006.01)
  *H03K 3/03* (2006.01)

(52) U.S. Cl.
  CPC .......... *H03M 1/125* (2013.01); *H03K 3/0315* (2013.01)

(58) Field of Classification Search
  CPC .......... H03M 1/50; H03M 1/12; H03M 1/002; H03M 1/1245; H03M 1/60; H03M 1/14; H03M 1/0836; H03M 1/00; H03M 1/125; H03M 1/145; H03M 1/82; H03M 1/1215; H03M 3/496; H03M 7/3004; H03M 1/0624; H03M 1/164; H03M 3/466; H03M 1/0695; H03M 1/0607; H03M 1/0621; H03M 1/1028; H03M 1/361; H03M 3/458; H03M 1/1061; H03M 1/167
  USPC .................................................. 341/155, 156
  See application file for complete search history.

(56) References Cited

U.S. PATENT DOCUMENTS

| 6,101,197 A | * | 8/2000 | Keeth | G06F 1/10 370/503 |
| 9,680,480 B1 | * | 6/2017 | Fredenburg | H03L 7/099 |
| 9,971,312 B1 | * | 5/2018 | Hailu | H03M 1/504 |
| 10,270,460 B1 | * | 4/2019 | Buffa | H03M 1/1245 |

(Continued)

FOREIGN PATENT DOCUMENTS

WO WO-2019117803 A1 * 6/2019 ........... G04F 10/005

OTHER PUBLICATIONS

Daniels, Jorg et al., "All-Digital Differential VCO-based A/D Conversion", IEEE Proceedings of 2010 International Symposium on Circuits and Systems, 10.1109/ISCAS.2010.5537342, May 30-Jun. 2, 2010, 4 pages.

(Continued)

*Primary Examiner* — Linh V Nguyen
(74) *Attorney, Agent, or Firm* — Slater Matsil, LLP

(57) ABSTRACT

An analog-to-digital converter includes a voltage-controlled oscillator (VCO) having an input for receiving an analog input signal; a double binary counter having a first input coupled to a first output of the VCO, a second input coupled to a second output of the VCO; a first set of registers coupled to the first output of the double binary counter; a second set of registers coupled to the second output of the double binary counter; sense amplifiers coupled to the outputs of the VCO; and a correction component coupled to the first set of registers, the second set of registers, and the sense amplifiers, wherein the correction component generates a coarse count, a fine count, and combines the coarse count and the fine count to provide a digital output signal representative of the analog input signal.

19 Claims, 11 Drawing Sheets

(56) References Cited

U.S. PATENT DOCUMENTS

| | | | |
|---|---|---|---|
| 10,520,901 B2* | 12/2019 | Wu | H03L 7/191 |
| 10,886,930 B1* | 1/2021 | Buffa | H03K 3/0315 |
| 10,895,850 B1* | 1/2021 | Elkholy | H03M 3/368 |
| 2006/0139194 A1* | 6/2006 | Hasegawa | H03L 7/1976 |
| | | | 341/143 |
| 2017/0085365 A1* | 3/2017 | Ravi | G04F 10/005 |
| 2017/0307668 A1* | 10/2017 | Buffa | G01R 27/2605 |

OTHER PUBLICATIONS

Quintero, Andres et al., "A Coarse-Fine VCO-ADC for MEMS Microphones With Sampling Synchronization by Data Scrambling", IEEE Solid-State Circuits Letters, vol. 3, 10.1109/LSSC.2020.2964158, Jan. 6, 2020, 4 pages.

Unnikrishnan, Vishnu et al., "Mitigation of Sampling Errors in VCO-Based ADCs", IEEE Transactions on Circuits and Systems-I: Regular Papers, vol. 64, No. 7, Jul. 2017, 10 pages.

* cited by examiner

*Table 1*

| RO | RO - Ordered | PO |
|---|---|---|
| 0 | 0 | 0 |
| 1 | 2 | 1 |
| 2 | 4 | 2 |
| 3 | 6 | 3 |
| 4 | 1 | 4 |
| 5 | 3 | 5 |
| 6 | 5 | 6 |

FIG. 5

*Table 2*

| SA | 0 | 1 | 2 | 3 | 4 | 5 | 6 |
|----|---|---|---|---|---|---|---|
| RO | 0 | 1 | 2 | 3 | 4 | 5 | 6 |

FIG. 6

*Table 3*

| SA | PO |
|---|---|
| 0 | 0 |
| 1 | 4 |
| 2 | 1 |
| 3 | 5 |
| 4 | 2 |
| 5 | 6 |
| 6 | 3 |

FIG. 7

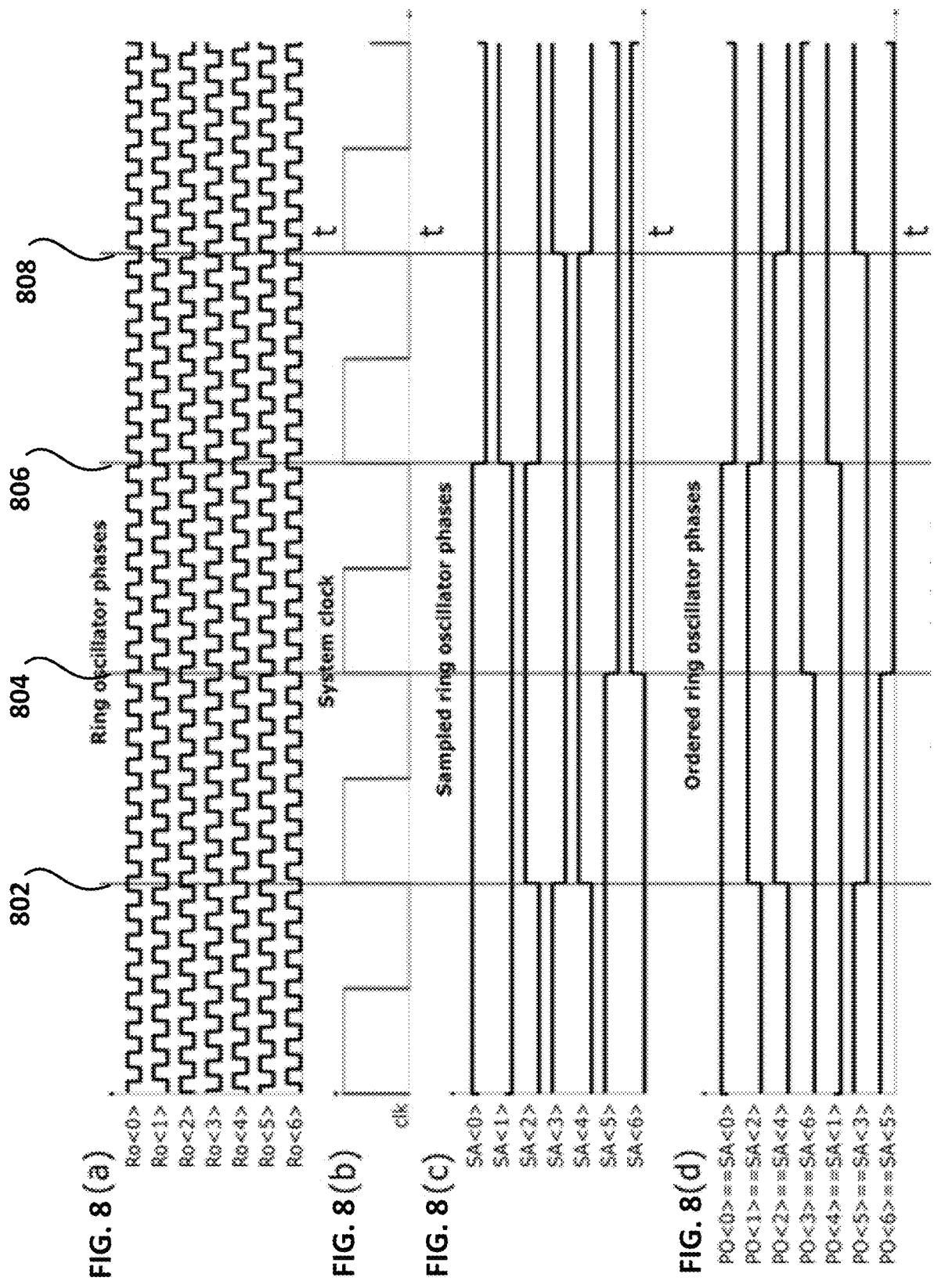

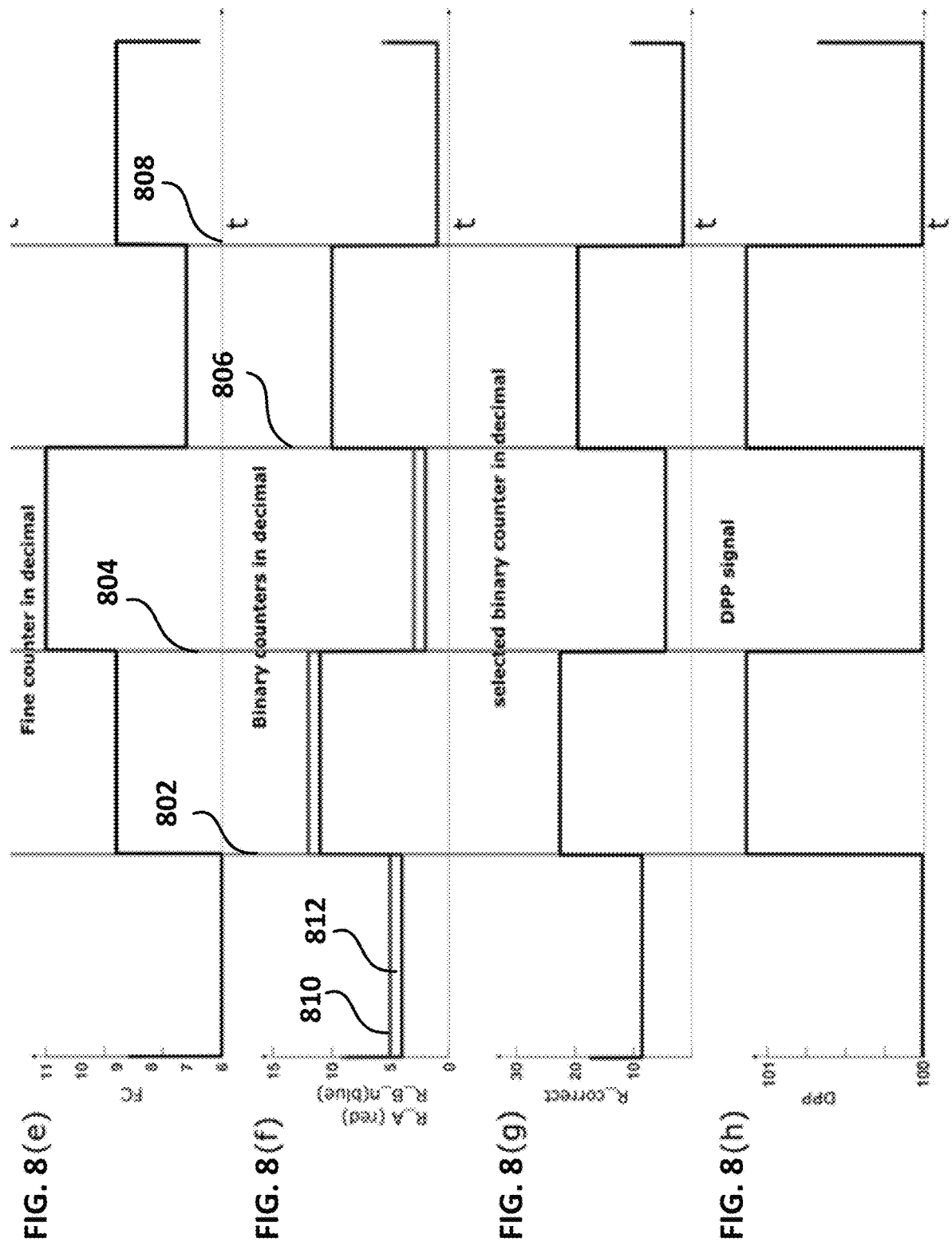

COARSE-FINE COUNTING ARCHITECTURE FOR A VCO-ADC BASED ON INTERLOCKED BINARY ASYNCHRONOUS COUNTERS

TECHNICAL FIELD

The present invention relates generally to a coarse-fine counting architecture for a voltage-controlled (VCO) analog-to-digital converter (ADC), and to a corresponding method.

BACKGROUND

Low cost digital microphones can include a microelectromechanical system (MEMS) microphone, a biasing circuit, and an analog-to-digital converter (ADC). The competitiveness of a low cost digital microphone is mainly given by its performance (including power consumption, dynamic range, and resolution, as well as other performance criteria) and its cost (silicon area, package size vs. sensitivity, as well as other cost items). Sigma-Delta ADCs currently available have been pushed to technology limits and market trends require innovative solutions to improve performance while reducing cost. Voltage-controlled-oscillator-based ADCs (VCO-ADCs) are promising alternatives to conventional voltage-encoding-based circuits. For a VCO-ADC built with a multiphase Ring Oscillator (RO), the power consumption of the quantization circuitry is dominated by the digital counting circuitry. To save power, counting circuits having a coarse-fine architecture have been used. The counting circuits using available coarse-fine architectures are well suited for many low cost applications such as low cost digital microphones. However, as described above, market trends demand further improvements in performance and further reductions in power consumption.

SUMMARY

According to an embodiment, an analog-to-digital converter (ADC) includes a voltage-controlled oscillator (VCO) having an input for receiving an analog input signal, and having a plurality of outputs; a double binary counter having a first input coupled to a first output of the plurality of outputs of the VCO, a second input coupled to a second output of the plurality of outputs of the VCO, a first output, and a second output; a first plurality of registers coupled to the first output of the double binary counter; a second plurality of registers coupled to the second output of the double binary counter; a plurality of sense amplifiers coupled to the plurality of outputs of the VCO; and a correction component coupled to the first plurality of registers, the second plurality of registers, and the plurality of sense amplifiers, the correction component being configured to generate a coarse count, to generate a fine count, and to combine the coarse count and the fine count to provide a digital output signal representative of the analog input signal.

According to an embodiment, a converter includes a plurality of sense amplifiers having a plurality of phase signal inputs; a double binary counter having a first input coupled to a first phase signal input of the plurality of sense amplifiers and a second input coupled to a second phase signal input of the plurality of sense amplifiers; a first plurality of registers coupled to a first output of the double binary counter; a second plurality of registers coupled to a second output of the double binary counter; and a correction component coupled to the first plurality of registers, the second plurality of registers, and the plurality of sense amplifiers, the correction component being configured to generate a coarse count, to generate a fine count, and to combine the coarse count at a digital output.

According to an embodiment, a method includes generating a plurality of phase signals having a frequency dependent upon an analog input signal; using a double binary counter to generate a first count from a first phase signal of the plurality of phase signals and to generate a second count from a second phase signal of the plurality of phase signals; sampling the first count and the second count to generate a first plurality of sampled signals; sampling the plurality of phase signals to generate a second plurality of sampled signals; generating a coarse count in response to the first plurality of sampled signals; generating a fine count in response to the second plurality of sampled signals; and combining the coarse count and the fine count to generate a digital output signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a table of the input and output phase correspondence between the input of the sense amplifiers and the output of the phase reordering circuit shown in the block diagram of FIG. 2, according to an embodiment;

FIG. 6 is a table of the input and output phase correspondence of the sense amplifiers shown in FIG. 2, according to an embodiment;

FIG. 7 is a table of the input and output phase correspondence of the phase reordering circuit shown in the block diagram of FIG. 2, according to an embodiment;

FIGS. 8(a), 8(b), 8(c), 8(d), 8(e), 8(f), 8(g), and 8(h) are timing diagrams of signals associated with the block diagram of FIG. 2, according to an embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A coarse-fine counting architecture for a VCO-ADC based on interlocked binary asynchronous counters is described herein. A double asynchronous binary counter is used in embodiments to perform a coarse quantization of an analog input signal that is substantial free of coarse-fine synchronization errors. An asynchronous binary counter can advantageously have better power consumption than equivalent synchronous counters known in the art for large word lengths.

The coarse-fine counting architecture for a VCO-ADC uses a double asynchronous binary counter and the samplers of ring oscillator (RO) output phases to quantize only the RO rising edges, in embodiments. The operation of the coarse-fine counting architecture can be extended to the detection of both rising and falling edges, without important hardware changes, resulting in a virtual dual-edge architecture in embodiments. The coarse-fine counting architecture described herein advantageously includes RO output phases that do not need level shifters to be sampled in embodiments. The RO can be sampled with clocked sense amplifiers, which allows a significant power saving. Thus, the number of level shifters is decreased to a minimum of two per channel and consequently, the power consumption can be reduced.

In the rising edge only embodiment, the correction component is configured to compute only the rising edges of the ring oscillator output phases, whereas in the rising and falling edge embodiment the correction component is configured to compute both the rising and falling edges of the ring oscillator output phases. The correction component can be easily configured to accommodate the rising edge only embodiment or the rising and falling edge embodiment by the use of corresponding specific correction component hardware or can be programmed to accommodate both embodiments through instructions from a microprocessor when the correction component is implemented in software.

Figure 1:
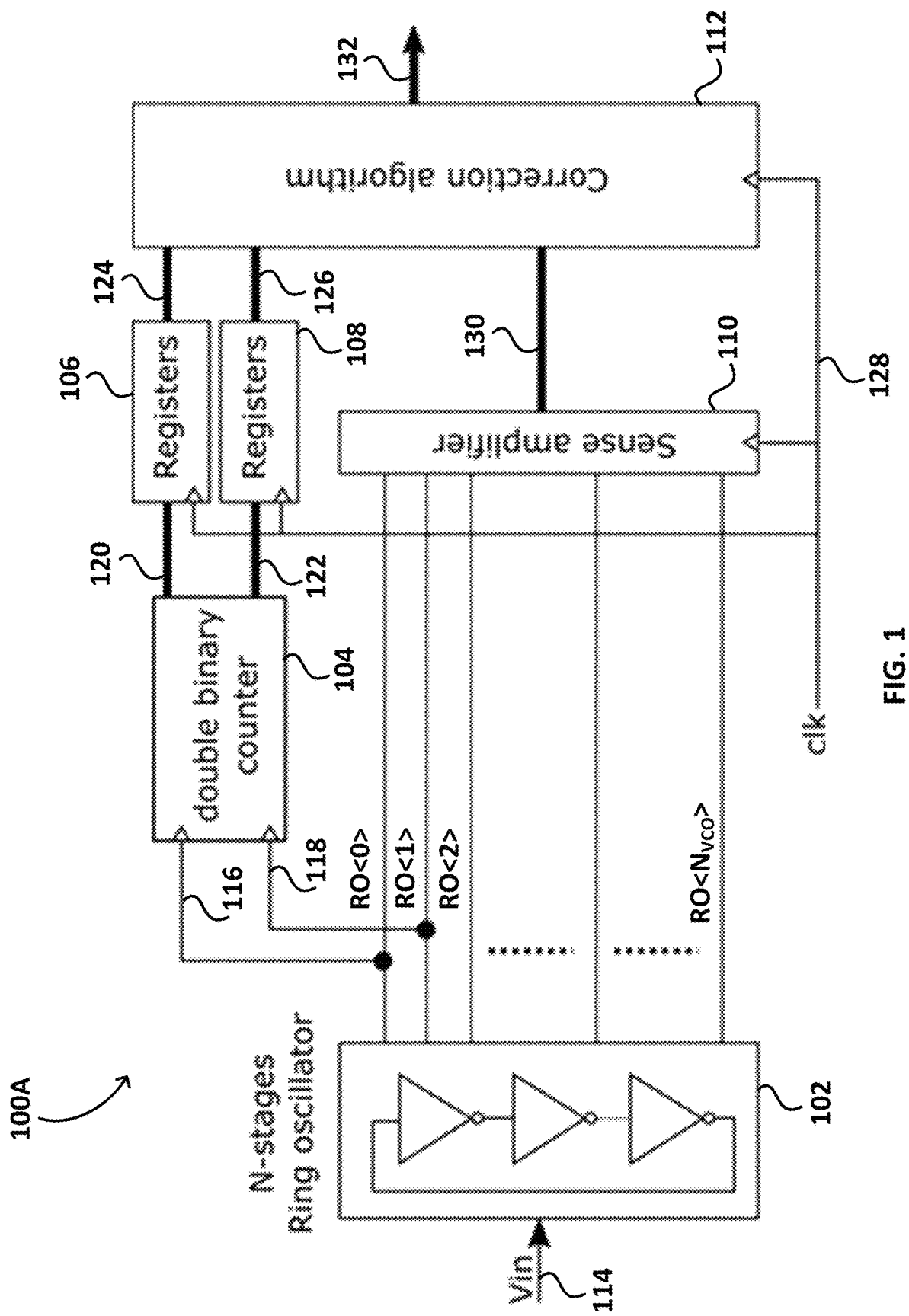
FIG. 1 is a block diagram of a VCO-ADC according to an embodiment.
Figure 2:
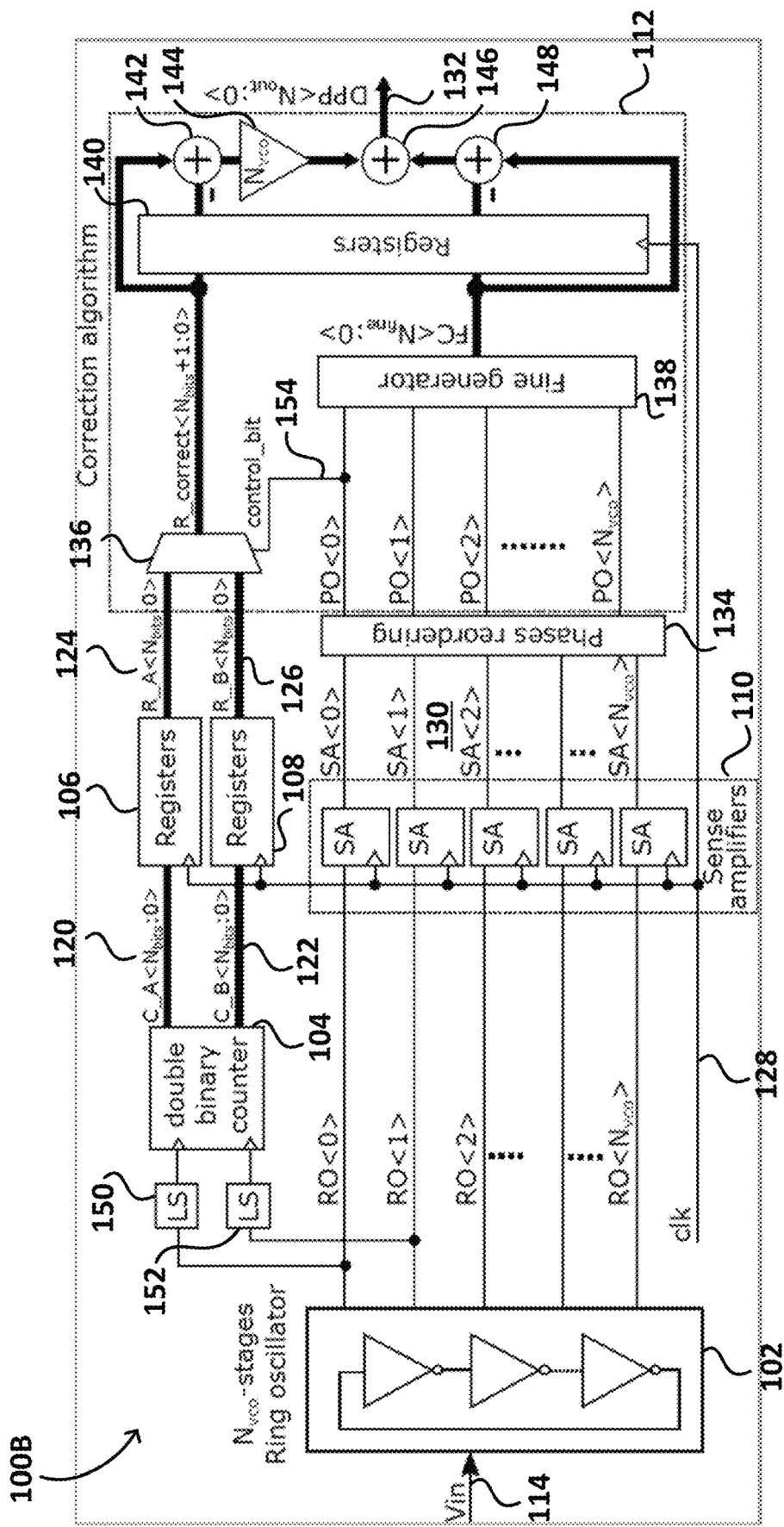
FIG. 2 is a more detailed block diagram of the VCO-ADC shown in FIG. 1, according to an embodiment.

An efficient implementation of the coarse-fine counting architecture for a VCO-ADC according to embodiments uses two binary coarse counters implemented as asynchronous counters, as shown in FIG. 1 and FIG. 2, and described in detail below.

Using a double asynchronous binary counter as described herein provides a number of advantages for the performance characteristics and the power consumption of the coarse-fine counting architecture for a VCO-ADC, according to embodiments. The power consumption is reduced using the asynchronous operation when compared to prior art solutions. Given that only the input stage of the binary counters operates at the RO frequency, it is advantageously possible to use only two level shifters per channel, according to embodiments. The coarse counter output is generated in a binary code, so it is not necessary to use an additional circuit as a decoder. The double binary counter implementation is advantageously compatible with a double-edge quantization architecture. The coarse-fine counting architecture described herein reduces power consumption of the VCO-ADC by directly sampling the RO phases with a sampling clock using a set of sense amplifiers, which eliminates the need for a separate level shifter in each RO phase as in prior art solutions. Finally, in the coarse-fine counting architecture a digital post-processing component is used to compute the fine count from the oscillator sampled state.

According to embodiments, when using an asynchronous binary counter, the system sampling operation can occur during a counter update, resulting in erroneous sampled data. To overcome this issue, a correction algorithm is used to correct the metastability errors when sampling. According to embodiments, a second register clocked at the oscillator frequency acts as secondary counter, which enables the low power operation in the coarse counter.

In summary, by using the double asynchronous binary counter architecture described herein, extra decoding logic is eliminated, metastability problems in the coarse counter are eliminated, and the power consumption of the VCO-ADC using the double asynchronous binary counter architecture is significantly reduced.

FIG. 1 is a block diagram of a VCO-ADC implementing the coarse-fine counting architecture, according to an embodiment. Analog-to-digital converter 100A includes a voltage-controlled ring oscillator 102 (also referred to herein as VCO 102) having an input 114 for receiving an analog input signal Vin, and having a plurality of outputs for providing a plurality of phase output signals, wherein each of the phase output signals has a different phase. In FIG. 1, the outputs of VCO 102 are labeled RO<0>, RO<1>, RO<2>, and RO<$N_{VCO}$>. The first three outputs are outputs R<0>, R<1>, and R<2>, and a last output is output RO<$N_{VCO}$>. Any number of oscillator outputs can be used, including a number less than or greater than the number of oscillator outputs shown in FIG. 1. Analog-to-digital converter 100A also includes an asynchronous double binary counter 104 having a first input 116 coupled to the first output <0> of the plurality of outputs of the VCO 102, a second input 118 coupled to a second output of the plurality of outputs of the VCO 102, a first output 120, and a second output 122. A first plurality of registers 106 includes inputs coupled to the first output 120 of the asynchronous double binary counter 104, and an output 124. A second plurality of registers 108 includes inputs coupled to the second output 122 of the asynchronous double binary counter 104, and an output 126. A plurality of sense amplifiers 110 includes inputs coupled to the plurality of outputs of the VCO 102, and an output 130. A correction component 112 has inputs coupled to the first plurality of registers 106, the second plurality of registers 108, and the plurality of sense amplifiers 110. In an embodiment, correction component 112 is configured to generate a coarse count, to generate a fine count, and to combine the coarse count and the fine count to provide a digital output signal 132 representative of the analog input signal. Correction component 112 can be implemented as a hardware circuit such as an integrated circuit, or as software instructions executed in, for example, a microprocessor. Registers 106, registers 108, sense amplifiers 110, and correction component 112 each include a clock input coupled to node 128 for receiving a clock signal CLK, in an embodiment.

Further details of each of the components described above associated with VCO-ADC, as well as the operation thereof, is described below with respect to FIG. 2 and other drawing figures.

FIG. 2 is a more detailed block diagram of the VCO-ADC shown in FIG. 1, according to an embodiment. VCO-ADC 100B of FIG. 2 includes the voltage-controlled ring oscillator 102, asynchronous double binary counter 104, registers 106, registers 108, sense amplifiers 110, and correction component previously described and shown in FIG. 1. The outputs of voltage-controlled ring oscillator 102 are also labeled RO<0>, RO<1>, RO<2>, and RO<$N_{VCO}$> in FIG. 2. Sense amplifiers 110 are shown to include a plurality of individual sense amplifiers each labeled "SA". The outputs 130 of sense amplifiers 110 are further individually labeled SA<0>, SA<1>, SA<2>, and SA<$N_{VCO}$> in FIG. 2. The first output 120 of asynchronous double binary counter 104 is further labeled C_A<$N_{BITS}$:0> and the second output 122 of asynchronous double binary counter 104 is labeled C_B<$N_{BITS}$:0> in FIG. 2. Further details of the correction component 112 are shown in FIG. 2 and are discussed in further detail below.

Additional components are also shown in FIG. 2 associated with VCO-ADC 100B. For example, in an embodiment a first level shifter 150 is interposed between the first output of voltage-controlled ring oscillator 102 and the first input of asynchronous double binary counter 104, and a second level shifter 152 is interposed between the second output of voltage-controlled ring oscillator 102 and the second input of asynchronous double binary counter 104. A phase reordering component 34 is interposed between sense amplifiers 110 and correction component 112, in an embodiment. The outputs of the phase reordering component 134 are labeled PO<0>, PO<1>, PO<2>, and PO<$N_{VCO}$> in FIG. 2. Phase reordering component 134 can be implemented as a hardware circuit such as an integrated circuit, or as software instructions executed in, for example, a microprocessor.

Correction component 112 includes a number of components shown in FIG. 2 to generate a coarse count, to generate a fine count, and to combine the coarse count and the fine count to provide a digital output signal representative of the analog input signal. For example, correction component 112 includes a multiplexer 136 having a first input coupled to the first output of registers 106 and a second input coupled to the second output of registers 108. Multiplexer 136 also includes a control input 154 for receiving a control bit provided by the first phase reordered signal PO<0>. Multiplexer 136 also includes an output for providing the corrected multiplexed signal R_correct<$N_{BITS}$+1:0>, which is the coarse count signal. Correction component 112 also includes a fine generator component 138 for receiving the phase reordered PO signals to generate a fine count signal FC<$N_{FINE}$:0>. Registers 140 includes a first set of registers for sampling the coarse count signal and a second set of registers for sampling the fine count signal. A first summer 142 combines the coarse count signal and the sampled coarse count signal to provide a coarse count "first difference" signal. A second summer 148 combines the fine count signal and the sampled fine count signal to provide a fine count "first difference" signal. A gain stage 144 applies a gain of $N_{VCO}$ to the coarse count first difference signal. A third summer 146 is coupled to gain stage 144 and the second summer 148 to provide a digital output signal 132 representative of the analog input signal Vin. The digital output signal 132 is labeled DPP<NOUT:0> in FIG. 2. The operation of correction component is described in further detail below.

The components of the coarse-fine counting architecture for VCO-ADC 100B shown in FIG. 2 are described in further detail below with respect to drawing FIGS. 3-7. For simplicity, FIG. 2 shows only the single-ended channel configuration of the differential proposed architecture. All of the corresponding signals for the coarse-fine counting architecture for VCO-ADC 100B shown in Figure are also described in further detail below with respect to drawing FIGS. 8(a)-(h).

Voltage-controlled ring oscillator 102 comprises a number of serially-coupled inverters in an embodiment. The oscillation frequency of the voltage-controlled ring oscillator 102 is determined by the value of the analog input signal Vin at input 114. The oscillation frequency can vary from a rest frequency at a common mode voltage input signal to a frequency higher than the rest frequency that is proportional to the value of the analog input signal Vin. Signals RO<0> to RO<$N_{VCO}$> are the differently phased outputs of the consecutive inverters in the voltage-controlled ring oscillator 102. While a voltage-controlled oscillator is shown in FIG. 2, other types of oscillators can be used, such as a current-controlled oscillator using an analog current input signal. Other types of oscillators other than ring oscillators can also be used in embodiments.

Figure 3:
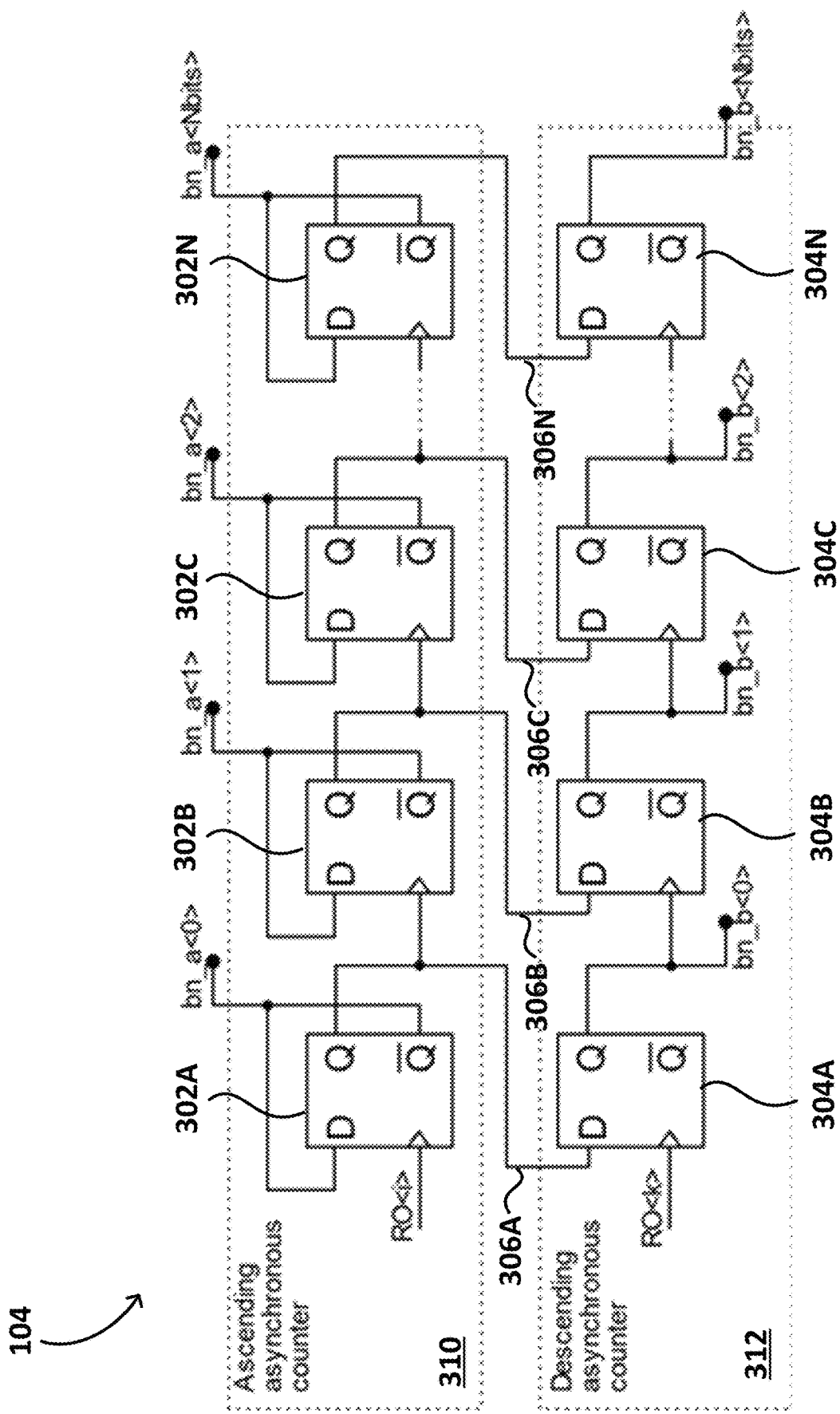
FIG. 3 is a schematic diagram of a double binary counter shown in the block diagrams of FIG. 1 and FIG. 2, according to an embodiment.

Asynchronous double binary counter 104 shown in FIG. 2 comprises two counters. An ascending asynchronous counter and a descending asynchronous counter locked to the ascending counter are used for the two counters in an embodiment. An example of this type of counter is shown in FIG. 3. Asynchronous double binary counter 104 includes an asynchronous ascending counter 310 comprising a plurality of serially-coupled D-type flip flops 302A, 302B, 302C through 302N and an asynchronous descending counter 312 comprising a plurality of serially-coupled D-type flips flops 304A, 304B, 304C through 304N in an embodiment. The two asynchronous counters including asynchronous ascending counter 310 and asynchronous descending counter 312 are locked together at internal nodes 306A, 306B, 306C through 306N as will be described in further detail below. The digital output code of asynchronous ascending counter 310 is labelled bn_a<0>, bn_a<1>, bn_a<2> through bn_a<Nbits>. The digital output code of asynchronous descending counter 312 is labelled bn_b<0>, bn_b<1>, bn_b<2> through bn_b<Nbits>. While an asynchronous ascending counter 310 and an asynchronous descending counter 312 are shown in FIG. 3, two ascending counters can be used, two descending counters can be used, or the order of the counters can be reversed in embodiments.

The number of bits of the counters is defined by "Nbits". The number of flip-flops of both the asynchronous ascending counter 310 and the asynchronous descending counter 312 are also defined by Nbits. In the first flip-flop 302A of asynchronous ascending counter 310, whose output $\overline{Q}$ is bn_a<0>, the clock input is connected to one of the RO signals (RO<i>), while the output $\overline{Q}$ corresponds to the output in binary code, in this case the LSB. The output Q is connected to the clock input of the next flip-flop 302B and to the input D of the first flip-flop 304A of the asynchronous descending counter 312. In the asynchronous descending counter 312, the clock input is connected to another phase of one of the RO signals (RO<k>). It is desirable that RO<i> and RO<k> are separated by at least a sufficient time for all of the flip-flops in each of the counters to toggle. The reason to include two binary counters including asynchronous ascending counter 310 and asynchronous descending counter 312 is to obtain two synchronized copies of the same count value recorded at different instants with different oscillator phases to avoid metastability issues. In this manner it can be inferred from the RO signal status, which of the copies is valid after sampling. The purpose of the asynchronous descending counter 312 is to have a backup copy of the count of the asynchronous ascending counter 310. In some prior art solutions, the backup copy of the count is accomplished by use of a separate register. The switching activity of the asynchronous descending counter 312 shown in FIG. 3 is exactly the same as in a binary asynchronous counter. Thus, a significant power savings is achieved using the asynchronous double binary counter 104 of VCO-ADC 100B.

Registers 106 and 108 sample the asynchronous double binary counter 104 outputs C_A<$N_{BITS}$:0> and C_B<$N_{BITS}$:0>. The registers 106 and 108 work with the system clock (CLK), which is asynchronous to the RO signals. The outputs 124 and 126 of registers 106 and 108 are further labelled R_A<Nbits:0> and R_B<Nbits:0> in FIG. 2, which correspond to the ascending and descending counter values, respectively. No synchronization between RO signal edges and CLK signal edges can be assumed and therefore setup and hold time violations may happen in the flip-flops, producing some metastability errors. Any suitable register implementation can be used for registers 106 and 108.

Figure 4:
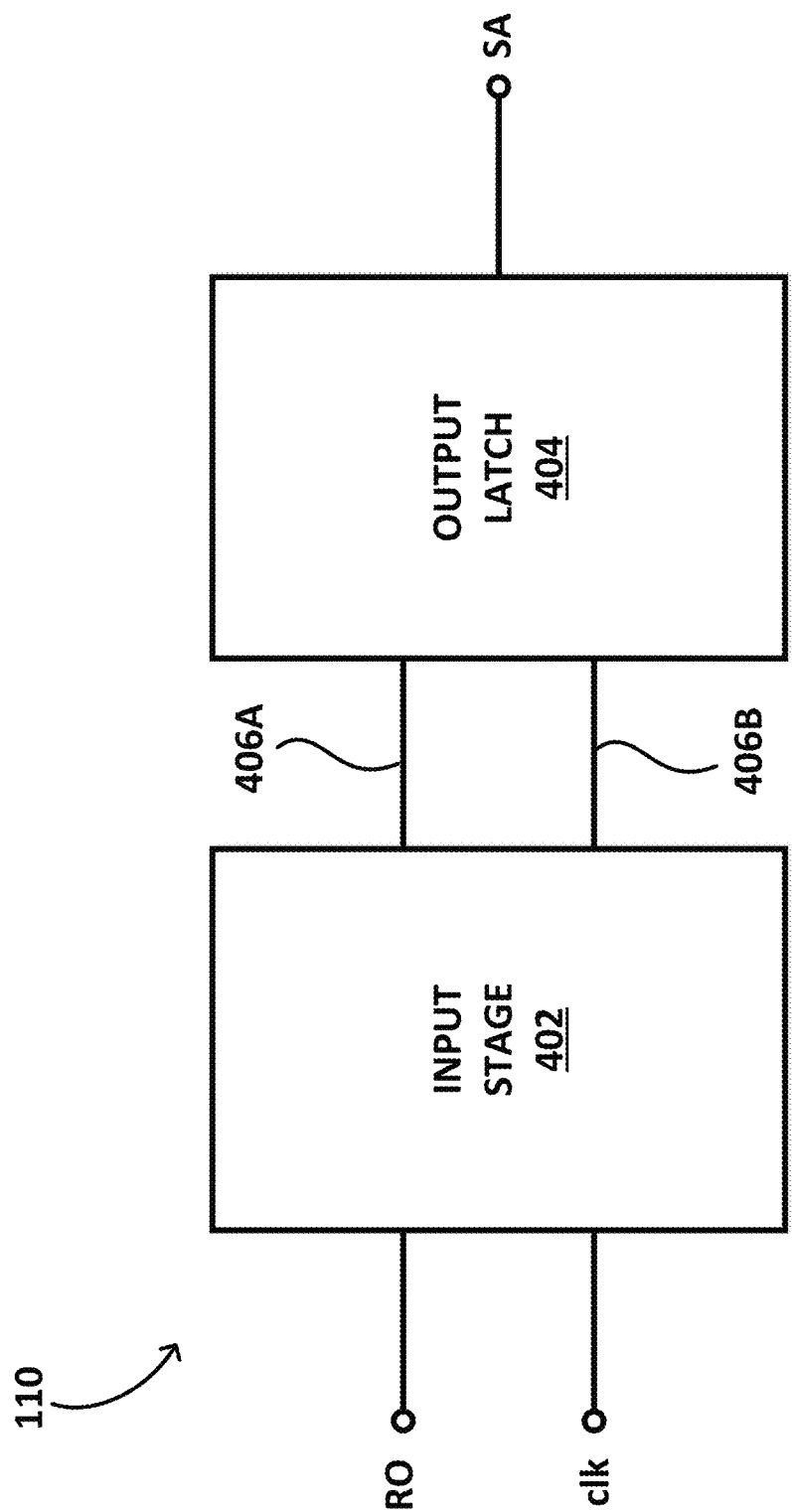
FIG. 4 is a block diagram of a sense amplifier shown in the block diagrams of FIG. 1 and FIG. 2, according to an embodiment.
Figure 6:
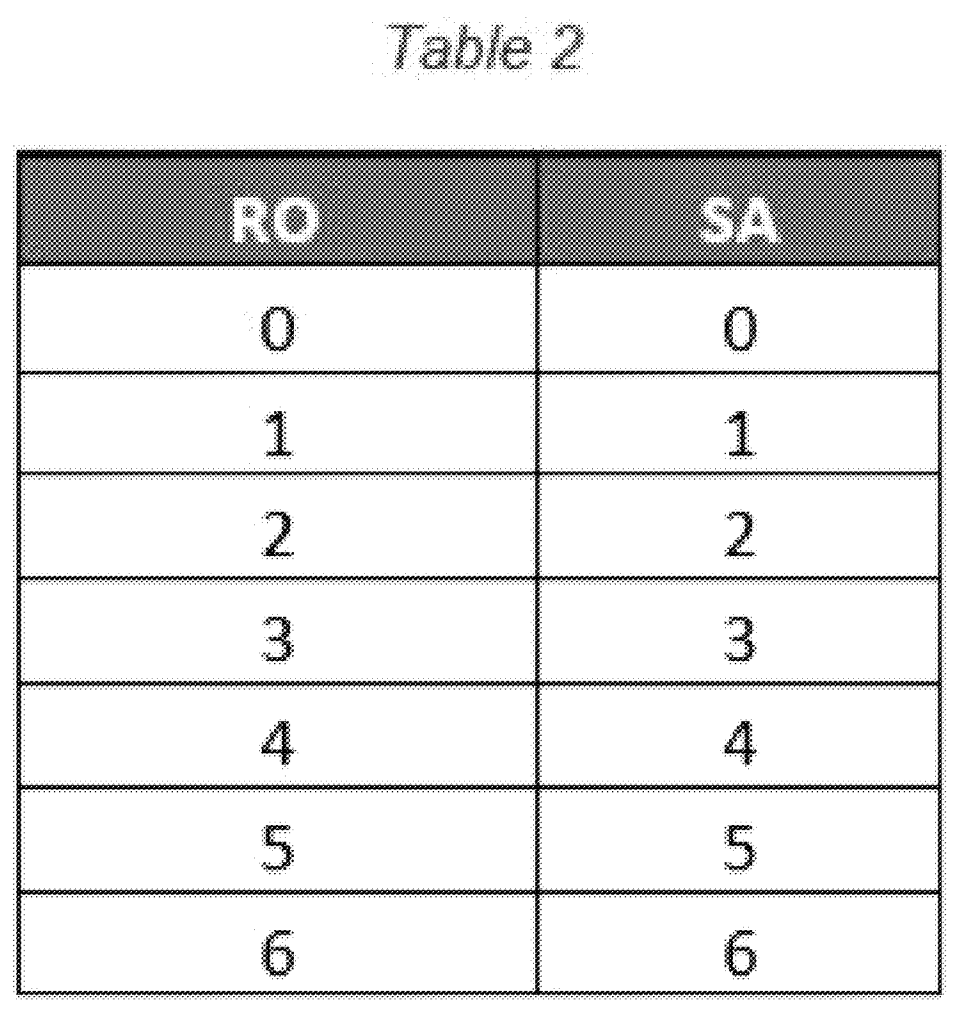

The function of sense amplifiers 110 is to sample the RO output signal phases at the CLK rate. An advantage of embodiments using sense amplifiers 110 lies in the reduced power consumption of VCO-ADC 100B since only two level shifters 150 and 152 are needed as shown in FIG. 2. Sense amplifiers 110 only consume power when the rising edges of the system clock arrive. An implementation of a single sense amplifier SA of sense amplifiers 110 is shown in FIG. 4. An input gain stage 402 includes a first input for receiving the corresponding RO signal and a second input for receiving the system CLK signal. A differential output 406A, 406B is coupled to a differential input of an output latch stage 404, which has a single-ended output SA. Any suitable input gain stage 402 and any suitable output latch stage 404 can be used. A one-to-one correspondence between the RO signal phases and the SA signal phases is shown in Table 2 of FIG. 6.

The phase reordering component 134 shown in FIG. 2 performs the reordering of the RO output phase signals. All the phases are reordered placing the even phases in a first group and the odd phases in a second group after the first group to order them in the correct successive edge sequence. For instance, the phases in the first group are RO<0>, RO<2> through RO<$N_{VCO}$>, and the phases in the second group are RO<1>, RO<3> through RO<$N_{VCO}$-1>. Table 1 shown in FIG. 5 is a phase reordering example for a seven phase ring oscillator. The RO column indicates the ring oscillator phase and RO-ordered column indicates the RO phase after reordering. The PO column indicates the new name of the RO phases after reordering.

The function of correction component 112 shown in FIG. 2 is primarily to calculate the value of coarse and fine counters. The coarse counter is calculated from the R_A and R_B signals. The fine counter is calculated from the PO signals. Once coarse and fine counts are estimated, their values are combined, after the first difference, in the DPP output signal. The DPP output signal is a digital representation of the analog input signal Vin. Each of the subcomponents of correction component 112 can be implemented as a hardware circuit sub-component or a digital software sub-component, according to embodiments.

FIGS. 8(a), 8(b), 8(c), 8(d), 8(e), 8(f), 8(g), and 8(h) are timing diagrams of signals associated with the block diagram of FIG. 2, according to an embodiment. The vertical axis in each of the timing diagrams represents the magnitude of the corresponding signal in digital code units, and the horizontal axis of all of the timing diagrams represents the time access, "t" in arbitrary time units. FIG. 8(a) shows the waveforms of the RO output phases, RO<0:6>, sampled by the sense amplifiers at the system clock rate. FIG. 8(b) shows the waveform of the CLK system clock signal. FIG. 8(c) shows the waveforms of the sampled ring oscillator phases SA<0:6>. FIG. 8(d) shows the waveforms of the ordered ring oscillator phases PO<0:6>. FIG. 8(e) shows the waveform of the fine counter (FC) in decimal. FIG. 8(f) shows the waveforms of the binary counters (R_A 810 and R_B_n 812) in decimal. FIG. 8(g) shows the waveform of the selected binary counter (R_correct) in decimal. FIG. 8(h) shows the waveform of the digital output signal (DPP). The four vertical lines 802, 804, 806, and 808 represent the time instants when the system clock signal CLK arrives and the sense amplifiers sample the RO outputs.

As previously described, the sense amplifier outputs (SA<6:0>) are the input to the phase reordering component 134. The phase reordering component performs the reordering of the SA phases, first with the even signals and afterwards with the odd signals. In the following lines the equivalent Matlab code for performing the phase reordering action is described.

```
for (i=0; i<N_VCO; i++)
  if (i<=N_VCO/2)
    PO<i>=SA<i*2>
  else
    PO<i>=SA<i*2-N_VCO-1>
  end
end
```

Figure 7:
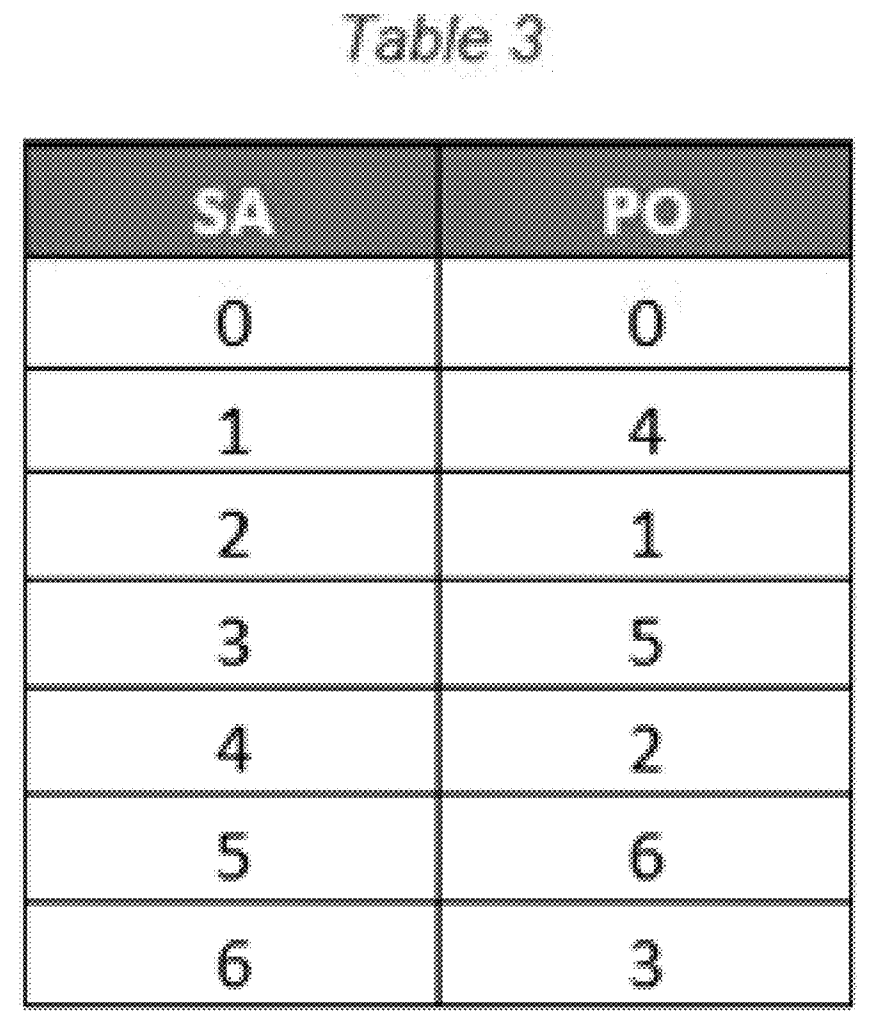

Using the above code, the relationship between the SA and PO signals can be seen in the following Table 3 shown in FIG. 7, wherein SA<0> corresponds to PO<0>, SA<1> corresponds to PO<4>, SA<2> corresponds to PO<1>, SA<3> corresponds to PO<5>, SA<4> corresponds to PO<2>, and SA<6> corresponds to PO<3>.

FIG. 8(d) thus represents the PO signals, after reordering the SA signals.

As previously described, the correction component 112 implements the functions to calculate the coarse and fine counts. The correction component 112 has as inputs the signals R_A, R_B and PO, and DPP as output signal. The R_A and R_B size is Nbits, each one, the PO size is $N_{VCO}$.

The coarse count is calculated as follows:

The R_B_n variable corresponds to not(R_B), see waveforms 810 and 812 of FIG. 8(f). Depending on the value of the PO<0> signal either R_A or R_B_n is selected through multiplexer 136, generating a signal R_Selected at an intermediate node (not shown in FIG. 2). R_A is selected when PO<0>=0 and R_B_n is selected when PO<0>=1.

R_selected is multiplied by two and a correction is applied depending on the PO signals, to generate the R_correct signal as shown in FIG. 8(g). The code employed to calculate the R_correct value is shown below:

```
if PO<0>==1
  R_correct=R_B_n*2+1;
else if PO<0>==0
  R_correct=R_A*2;
end
```

The R_correct signal is multiplied by the number of RO phases. This result is saved as the R_mult variable (not shown in FIG. 2).

The fine count (FC) is calculated as a function of the value of the PO signals. FC is the variable where the fine counter value is saved. FC is calculated by sequentially evaluating the different bits of the PO signal. An embodiment algorithm that evaluates FC can be described with the following pseudocode:

```
control = 0;
for i = 1:Nvco
  if PO<0> == 0
    if control == 0
      FC = FC + 2;
      if PO<i+1> == 1
        control = 1;
      end
    elseif control == 1
      FC = FC + 1;
      if PO<i+i> == 0
        control = 2;
      end
    elseif control == 2
      FC = FC + 0;
```

-continued

```
        end
    end
if PO<o> == 1
    if control == o
        FC = FC + 2;
        if PO<i+i> == o
            control = 1;
        end
    elseif control == 1
        FC = FC + 1;
        if PO<i+i> == 1
            control = 2;
        end
    elseif control == 2
        FC = FC + o;
    end
end
end
```

In an embodiment, FC is a binary number, and the number of bits of the FC variable is equal to $\log_2(N_{VCO})+1$. Other algorithms that lead to the same calculation of FC are possible, but the use of the $N_{VCO}$ variable describes all possible numbers of ring oscillator output signals RO.

FIG. 8(e) depicts one possible example of the FC variable result in a decimal representation, after running the previous code, to quantize the RO rising and falling edges.

Once the correct values of R_mult and FC are determined, the ADC digital output code can be calculated. The first difference of R_mult and FC is performed. Then, these two results are combined in the single-ended channel output DPP<Nout:0>, with a bit width of $N_{bits}+1+\log_2(N_{vco})+1$. The DPP signal waveform is shown in FIG. 6(h).

Figure 9:
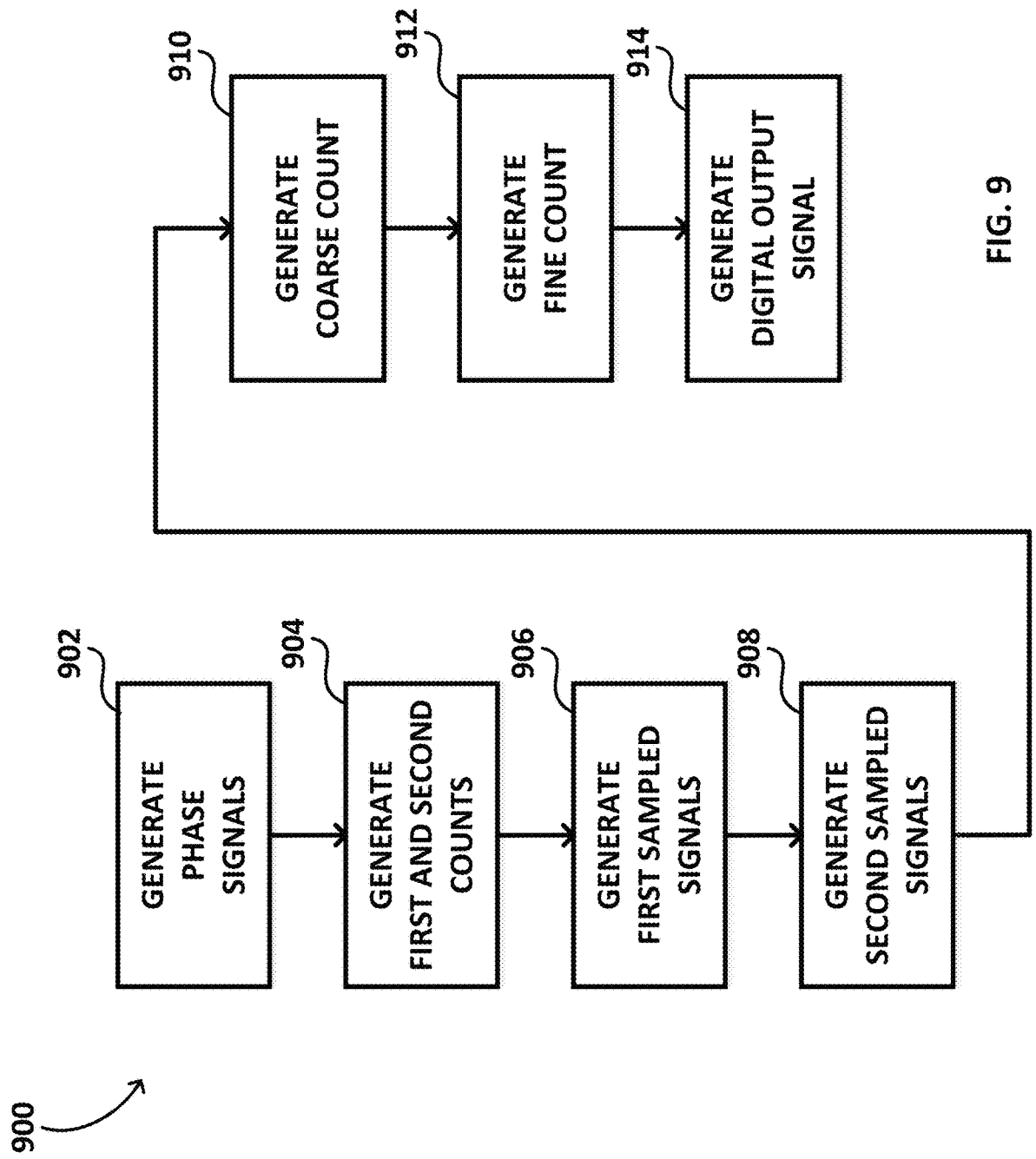
FIG. 9 is a block diagram of an analog-to-digital conversion method, according to an embodiment.

FIG. 9 is a block diagram goo of an analog-to-digital conversion method, according to an embodiment. The method includes generating a plurality of phase signals having a frequency dependent upon an analog input signal at step 902; using a double binary counter to generate a first count from a first phase signal of the plurality of phase signals and to generate a second count from a second phase signal of the plurality of phase signals at step 904; sampling the first count and the second count to generate a first plurality of sampled signals at step 906; sampling the plurality of phase signals to generate a second plurality of sampled signals at step 908; generating a coarse count in response to the first plurality of sampled signals at step 910; generating a fine count in response to the second plurality of sampled signals at step 912; and combining the coarse count and the fine count to generate a digital output signal at step 914. The analog-to-digital conversion method can include reordering the second plurality of sampled signals before generating the fine count, and generating the plurality of phase signals with a voltage-controlled oscillator (VCO), as previously described. The analog-to-digital conversion method can include sampling the first count and the second count and sampling the plurality of phase signals at a sampling rate frequency less than a rest frequency of the plurality of phase signals. The analog-to-digital conversion method can also include a double binary counter having a first asynchronous counter and a second asynchronous counter, and coupling an internal node of the first asynchronous counter to an internal node of the second asynchronous counter in an embodiment.

Figure 10:
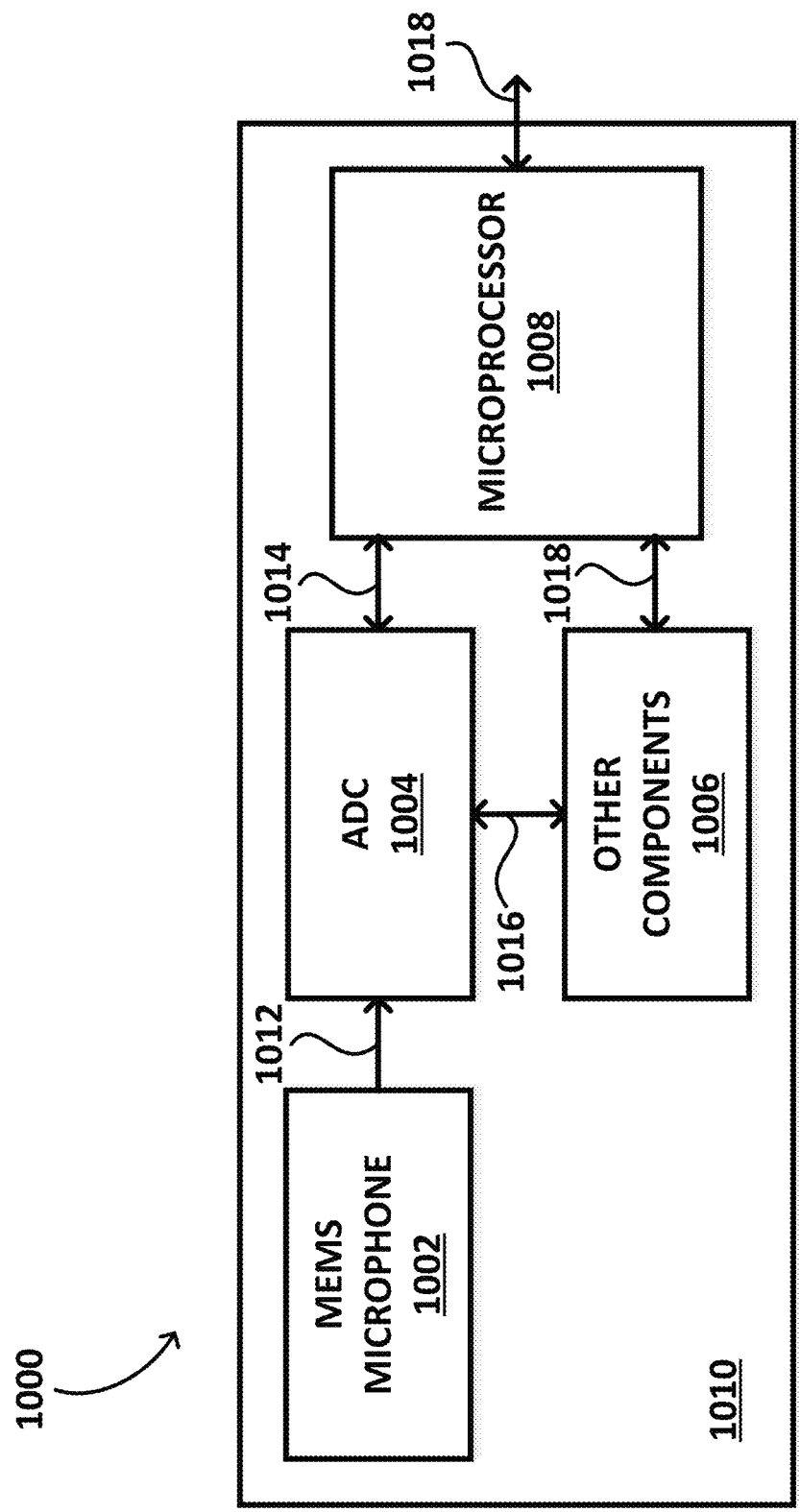
FIG. 10 is a block diagram of a product using a VCO-ADC, according to an embodiment.

FIG. 10 is a block diagram 1000 of a product 1010 using a VCO-ADC 1004, according to an embodiment. Product 1010 can include a MEMS device such as a MEMS microphone 1002 for generating an analog signal at node 1012. The analog signal is converted into a digital output signal at bus 1014 by VCO-ADC 1004. The digital output signal is received by microprocessor 1008 from VCO-ADC 1004, and control signals are received by VCO-ADC 1004 through bus 1014, in an embodiment. VCO-ADC 1004 is also in communication with other components 1006, which can include other analog and digital processing components, in an embodiment. The other components 1006 can also be in communication with microprocessor 1008 through bus 1018. Microprocessor 1008 can provide the digital output signal and received user input signals through bus 1018. While a specific embodiment of a representative of a product is shown in FIG. 10, other arrangements of the same or additional components can be used in other product embodiments using the coarse-fine counting architecture of the VCO-ADC converter described herein.

A VCO-ADC 100B as shown in FIG. 2 can be implemented using a CMOS semiconductor process. The VCO-ADC 100B can include a differential architecture, with single-ended channels similar as previously described with respect to FIG. 1 or FIG. 2. A VCO-ADC differential architecture is therefore the combination of two identical single-ended channels, similar to the architecture depicted in FIG. 1 or FIG. 2, in order to improve ADC performance. The voltage-controlled ring oscillator 102 can have a plurality of output phases. While any number of phases can be used, the number of phases includes 20, 30, 40, or more phases. For example 43 output signal phases can be used, in an embodiment. The bit length of the asynchronous double binary counter 104 can comprise 7 bits, although any number can be used. The number of sense amplifiers 110 of each channel is equal to the number or RO phases; one sense amplifier per RO phase. The VCO-ADC 100B can have two main operation modes in an embodiment, for example, a normal mode of operation (NM) with CLK=3.072 MHz and a low performance mode of operation (LP) with CLK=768 kHz. Intermediate modes can also be used that are intended for a seamless mode transition between the NM and LP modes, where the RO frequency can be changed. While specific clock frequencies are described in an embodiment, any suitable clock frequencies can be used to accommodate specific applications.

The VCO-ADC 100B shown in FIG. 2 and the product 1000 shown in FIG. 10 can be implemented in one or more integrated circuits each having a common substrate, in separate individual components on a circuit board, or in a hybrid circuit including both integrated circuits and separate components in embodiments. The functions described herein can be performed by various configurations of hardware and software components in embodiments.

In summary, in embodiments of the present invention a coarse-fine counting method to perform the quantization of a multiphase VCO-based ADC is described, with significant power improvement over prior art solutions. The counting method is based on a VCO-ADC having a double binary counter and a set of sense amplifiers, in an embodiment.

Example embodiments of the present invention are summarized here. Other embodiments can also be understood from the entirety of the specification and the claims filed herein.

Example 1

According to an embodiment, an analog-to-digital converter (ADC) includes a voltage-controlled oscillator (VCO) having an input for receiving an analog input signal, and having a plurality of outputs; a double binary counter having a first input coupled to a first output of the plurality of outputs of the VCO, a second input coupled to a second output of the plurality of outputs of the VCO, a first output, and a second output; a first plurality of registers coupled to the first output of the double binary counter, a second plurality of registers coupled to the second output of the double binary counter; a plurality of sense amplifiers coupled to the plurality of outputs of the VCO; and a correction component coupled to the first plurality of registers, the second plurality of registers, and the plurality of sense amplifiers, the correction component being configured to generate a coarse count, to generate a fine count, and to combine the coarse count and the fine count to provide a digital output signal representative of the analog input signal.

Example 2

The ADC of example 1, wherein the correction component is configured to generate the coarse count based on signals provided by the first plurality of registers and the second plurality of registers.

Example 3

The ADC of any of the above examples, wherein the correction component is configured to generate the fine count based on signals provided by the plurality of sense amplifiers.

Example 4

The ADC of any of the above examples, wherein the double binary counter comprises a first asynchronous counter and a second asynchronous counter.

Example 5

The ADC of any of the above examples, wherein at least one of the first asynchronous counter and the second asynchronous counter comprises a plurality of serially-connected D-type flip-flops.

Example 6

The ADC of any of the above examples, wherein the first asynchronous counter comprises a plurality of serially-connected D-type flip-flops and at least one internal node coupled to at least one internal node of the second asynchronous counter.

Example 7

The ADC of any of the above examples, further comprising a phase reordering circuit interposed between the plurality of sense amplifiers and the correction component.

Example 8

The ADC of any of the above examples, wherein the first plurality of registers are configured for sampling the first output of the double binary counter, and wherein the second plurality of registers are configured for sampling the second output of the double binary counter.

Example 9

The ADC of any of the above examples, wherein the first plurality of registers, the second plurality of registers, the plurality of sense amplifiers, and the correction component each comprise a clock input for receiving a clock signal.

Example 10

The ADC of any of the above examples, wherein a clock frequency of the clock signal is less than a rest frequency of the VCO.

Example 11

According to an embodiment, a converter includes a plurality of sense amplifiers having a plurality of phase signal inputs; a double binary counter having a first input coupled to a first phase signal input of the plurality of sense amplifiers and a second input coupled to a second phase signal input of the plurality of sense amplifiers; a first plurality of registers coupled to a first output of the double binary counter; a second plurality of registers coupled to a second output of the double binary counter, and a correction component coupled to the first plurality of registers, the second plurality of registers, and the plurality of sense amplifiers, the correction component being configured to generate a coarse count, to generate a fine count, and to combine the coarse count at a digital output.

Example 12

The converter of example 11, wherein the double binary counter comprises a first asynchronous counter and a second asynchronous counter.

Example 13

The converter of any of the above examples, wherein the first asynchronous counter comprises at least one internal node coupled to at least one internal node of the second asynchronous counter.

Example 14

The converter of any of the above examples, further comprising a phase reordering circuit interposed between the plurality of sense amplifiers and the correction component.

Example 15

According to an embodiment a method includes generating a plurality of phase signals having a frequency dependent upon an analog input signal; using a double binary counter to generate a first count from a first phase signal of the plurality of phase signals and to generate a second count from a second phase signal of the plurality of phase signals; sampling the first count and the second count to generate a first plurality of sampled signals; sampling the plurality of phase signals to generate a second plurality of sampled signals; generating a coarse count in response to the first plurality of sampled signals; generating a fine count in response to the second plurality of sampled signals; and combining the coarse count and the fine count to generate a digital output signal.

Example 16

The method of example 15, further comprising reordering the second plurality of sampled signals before generating the fine count.

Example 17

The method of any of the above examples, wherein generating the plurality of phase signals comprises generating the plurality of phase signals with a voltage-controlled oscillator (VCO).

Example 18

The method of any of the above examples, wherein sampling the first count and the second count and sampling the plurality of phase signals is performed at a sampling rate frequency less than a rest frequency of the plurality of phase signals.

Example 19

The method of any of the above examples, wherein using a double binary counter comprises using a double binary counter having a first asynchronous counter and a second asynchronous counter.

Example 20

The method of any of the above examples, further comprising coupling an internal node of the first asynchronous counter to an internal node of the second asynchronous counter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter (ADC) comprising:
a voltage-controlled oscillator (VCO) having an input for receiving an analog input signal, and having a plurality of outputs;
a double binary counter having a first input coupled to a first output of the plurality of outputs of the VCO, a second input coupled to a second output of the plurality of outputs of the VCO, a first output, and a second output;
a first plurality of registers coupled to the first output of the double binary counter;
a second plurality of registers coupled to the second output of the double binary counter;
a plurality of sense amplifiers coupled to the plurality of outputs of the VCO;
a correction component coupled to the first plurality of registers, the second plurality of registers, and the plurality of sense amplifiers, the correction component being configured to generate a coarse count, to generate a fine count, and to combine the coarse count and the fine count to provide a digital output signal representative of the analog input signal; and
a phase reordering circuit interposed between the plurality of sense amplifiers and the correction component.

2. The ADC of claim 1, wherein the correction component is configured to generate the coarse count based on signals provided by the first plurality of registers and the second plurality of registers.

3. The ADC of claim 1, wherein the correction component is configured to generate the fine count based on signals provided by the plurality of sense amplifiers.

4. The ADC of claim 1, wherein the double binary counter comprises a first asynchronous counter and a second asynchronous counter.

5. The ADC of claim 4, wherein at least one of the first asynchronous counter and the second asynchronous counter comprises a plurality of serially-connected D-type flip-flops.

6. The ADC of claim 4, wherein the first asynchronous counter comprises a plurality of serially-connected D-type flip-flops and at least one internal node coupled to at least one internal node of the second asynchronous counter.

7. The ADC of claim 1, wherein the first plurality of registers are configured for sampling the first output of the double binary counter, and wherein the second plurality of registers are configured for sampling the second output of the double binary counter.

8. The ADC of claim 1, wherein the first plurality of registers, the second plurality of registers, the plurality of sense amplifiers, and the correction component each comprise a clock input for receiving a clock signal.

9. The ADC of claim 8, wherein a clock frequency of the clock signal is less than a rest frequency of the VCO.

10. A converter comprising:
a plurality of sense amplifiers having a plurality of phase signal inputs;
a double binary counter having a first input coupled to a first phase signal input of the plurality of sense amplifiers and a second input coupled to a second phase signal input of the plurality of sense amplifiers;
a first plurality of registers coupled to a first output of the double binary counter;
a second plurality of registers coupled to a second output of the double binary counter;
a correction component coupled to the first plurality of registers, the second plurality of registers, and the plurality of sense amplifiers, the correction component being configured to generate a coarse count, to generate a fine count, and to combine the coarse count at a digital output; and
a phase reordering circuit interposed between the plurality of sense amplifiers and the correction component.

11. The converter of claim 10, wherein the double binary counter comprises a first asynchronous counter and a second asynchronous counter.

12. The converter of claim 11, wherein the first asynchronous counter comprises at least one internal node coupled to at least one internal node of the second asynchronous counter.

13. The converter of claim 10, further comprising a phase reordering circuit interposed between the plurality of sense amplifiers and the correction component.

14. A method comprising:
generating a plurality of phase signals having a frequency dependent upon an analog input signal;
using a double binary counter having a first asynchronous counter and a second asynchronous counter to generate a first count from a first phase signal of the plurality of phase signals and to generate a second count from a second phase signal of the plurality of phase signals;
coupling an internal node of the first asynchronous counter to an internal node of the second asynchronous counter:
sampling the first count and the second count to generate a first plurality of sampled signals;

sampling the plurality of phase signals to generate a second plurality of sampled signals;
generating a coarse count in response to the first plurality of sampled signals;
generating a fine count in response to the second plurality of sampled signals; and
combining the coarse count and the fine count to generate a digital output signal.

15. The method of claim 14, further comprising reordering the second plurality of sampled signals before generating the fine count.

16. The method of claim 14, wherein generating the plurality of phase signals comprises generating the plurality of phase signals with a voltage-controlled oscillator (VCO).

17. The method of claim 14, wherein sampling the first count and the second count and sampling the plurality of phase signals is performed at a sampling rate frequency less than a rest frequency of the plurality of phase signals.

18. An analog-to-digital converter (ADC) comprising:
a voltage-controlled oscillator (VCO) having an input for receiving an analog input signal, and having a plurality of outputs;
a double binary counter having a first input coupled to a first output of the plurality of outputs of the VCO, a second input coupled to a second output of the plurality of outputs of the VCO, a first output, and a second output;
a first plurality of registers coupled to the first output of the double binary counter;
a second plurality of registers coupled to the second output of the double binary counter;
a plurality of sense amplifiers coupled to the plurality of outputs of the VCO; and
a correction component coupled to the first plurality of registers, the second plurality of registers, and the plurality of sense amplifiers, the correction component being configured to generate a coarse count, to generate a fine count, and to combine the coarse count and the fine count to provide a digital output signal representative of the analog input signal,
wherein the double binary counter comprises a first asynchronous counter and a second asynchronous counter, and wherein the first asynchronous counter comprises at least one internal node coupled to at least one internal node of the second asynchronous counter.

19. A converter comprising:
a plurality of sense amplifiers having a plurality of phase signal inputs;
a double binary counter having a first input coupled to a first phase signal input of the plurality of sense amplifiers and a second input coupled to a second phase signal input of the plurality of sense amplifiers;
a first plurality of registers coupled to a first output of the double binary counter;
a second plurality of registers coupled to a second output of the double binary counter; and
a correction component coupled to the first plurality of registers, the second plurality of registers, and the plurality of sense amplifiers, the correction component being configured to generate a coarse count, to generate a fine count, and to combine the coarse count at a digital output,
wherein the double binary counter comprises a first asynchronous counter and a second asynchronous counter, and wherein the first asynchronous counter comprises at least one internal node coupled to at least one internal node of the second asynchronous counter.

* * * * *